United States Patent [19]

Yamaguchi et al.

[11] Patent Number: 5,174,853

[45] Date of Patent: Dec. 29, 1992

[54] FORSTERITE SINGLE CRYSTAL AND METHOD FOR THE MANUFACTURE OF THE SAME

[75] Inventors: Yasuhide Yamaguchi; Yukio Nobe; Akiko Sugimoto, all of Ageo, Japan

[73] Assignee: Mitsui Mining & Smelting Co., Ltd., Tokyo, Japan

[21] Appl. No.: 750,457

[22] Filed: Aug. 27, 1991

[30] Foreign Application Priority Data

Sep. 12, 1990 [JP] Japan .................................. 2-240085

[51] Int. Cl.$^5$ .............................................. C30B 15/00
[52] U.S. Cl. ............................. 156/617.1; 156/618.1; 156/DIG. 71; 156/DIG. 73; 156/DIG. 80; 156/DIG. 89
[58] Field of Search ......... 156/617.1, 618.1, DIG. 71, 156/DIG. 73, DIG. 80, DIG. 89

[56] References Cited

U.S. PATENT DOCUMENTS

| 4,824,598 | 4/1989 | Stokowski | 156/617.1 |
| 4,932,031 | 6/1990 | Alfano et al. | 372/18 |

FOREIGN PATENT DOCUMENTS

| 0319332 | 6/1989 | European Pat. Off. | |
| 61-266397 | 11/1986 | Japan | |
| 2-192493 | 7/1990 | Japan | 156/DIG. 80 |

OTHER PUBLICATIONS

"Laser Action in Chromium-doped Forsterite"; Petricevic et al.; Electronic Materials Research Laboratory, Mitsui Mining & Smelting Co., Ltd.; *Appl Phy Lett* (52) 13, Mar. 28, 1988 pp. 1040–1042.

Applied Physics Letters, vol. 53, No. 26, Dec. 26, 1988, New York, US, pp. 2590–2592, Petricevic et al.; Laser Action in Chromium-Activated Forsterite . . . .

Soviet Physics Doklady, vol. 35, No. 1, Dec. 1988, New York, US, pp. 75–77; Denker et al.; Pleochroism and Polarized Luminescence . . . .

Japanese Journal of Applied Physics, vol. 28, No. 10, Oct. 1989, Tokyo, JP, pp. 1833–1835; Sugimoto et al.; Flash Lamp Pumped . . . .

Patent Abstracts of Japan, vol. 14, No. 470 (C-0769) Oct. 15, 1990, & JP-A-02 192 493 (Mitsui Mining & Smelting Co. Ltd.) Jul. 30, 1990.

*Primary Examiner*—Olik Chaudhuri
*Assistant Examiner*—Felisa Garrett
*Attorney, Agent, or Firm*—Bucknam and Archer

[57] ABSTRACT

In a method for manufacturing forsterite single crystals containing tetravalent chromium as luminescent ions, the method which comprises the use of chromium dioxide or comprises the use of a sintered body obtained either by sintering in a non-reducing atmosphere chromium trioxide or a mixture of at least 30 wt. % of chromium trioxide with up to 70 wt. % of dichromium trioxide, together with other oxide materials for forsterite, or by firing in an oxidizing atmosphere a mixture of more than 70 wt. % of dichromium trioxide with less than 30 wt. % of chromium trioxide, together with other oxide materials for forsterite. This invention also relates to forsterite single crystals obtained by each of the above methods.

5 Claims, 1 Drawing Sheet

FORSTERITE SINGLE CRYSTAL AND METHOD FOR THE MANUFACTURE OF THE SAME

BACKGROUND OF THE INVENTION

1. Field of the Invention

This invention relates to forsterite ($Mg_2SiO_4$) single crystals using therein tetravalent chromium ions as active ions for oscillating lasers and also to a method for the manufacture of said single crystals.

2. Prior Art

Solid lasers are being increasingly used in various industrial fields because of their small size, high output efficency, easy maintenance and excellent stability.

It has been reported by V. Petricevic et al. that forsterite single crystals containing chromium ions oscillate lasers at 1167–1345 nm by exciting said crystals with YAG lasers at 1064 nm (Applied Optics, Vol. 27, No. 20/15, October, 1988).

This laser oscillating wavelength of 1167–1345 nm is an extremely longer one than a laser oscillating wavelength provided by laser single crystals to which trivalent chromium ions have been added. Thus, the luminescent ions in the chromium ion-added forsterite have been considered to be tetravalent chromium ions.

It has been reported that chromium ion-added forsterite single crystals may oscillate lasers at 1200 nm and its neighborhood. In this case, however, the oscillation efficiency of said crystals is so low that they are not suitable yet for industrial use, and, therefore, the efficiency is needed to be further enhanced.

In the manufacture of tetravalent chromium ion-added forsterite single crystals, dichromium trioxide has heretofore been widely used. In the growing-up by a so-called Czochralski method, an inert atmosphere or low oxygen-content atmosphere is needed to protect expensive iridium-made crucibles for use in the growing-up. Thus, in this case, it is difficult to have trivalent chromium ions contained as tetravalent ones in the single crystals, whereas a part of chromium ions are contained rather as divalent ones therein. Thus, these divalent chromium ions cause absorption of lasers having a wavelength region including 1500–1800 nm as the central portion of the wavelength region, and this absorption remarkably decreases the efficiency of laser oscillation at about 1200 nm.

On the other hand, in a case where chromium trioxide ($CrO_3$) is used as a chromium ion additive for forsterite, tetravalent chromium ions can be contained in forsterite; however, in this case, iridium crucibles used are oxidized or made fragile and may be cracked whereby this method is made inferior in economy and producibility.

SUMMARY OF THE INVENTION

The primary object of this invention is to provide, in view of the above disadvantages, new forsterite single crystals which are capable of oscillating lasers highly efficiently and are excellent in economy and producibility, as well as a method for the manufacture of said new forsterite single crystals.

The above object of this invention may be achieved by using certain chromium materials and additionally using specified manufacturing conditions.

The method for the manufacture of the new forsterite of this invention is characterized by using chromium dioxide or chromium trioxide and/or dichromium trioxide as the starting chromium material and then, as desired, sintering said starting chromium material in a predetermined atmosphere thereby to obtain the desired new forsterite.

In a method for manufacturing forsterite containing chromium as luminescent ions, there are used magnesium oxide (MgO), silicon dioxide ($SiO_2$) and chromium (Cr) ions which are luminescent ions.

In the present invention, there are used, as chromium oxides, chromium dioxide ($CrO_2$), or chromium trioxide ($CrO_3$) and/or dichromium trioxide ($Cr_2O_3$) in order to have tetravalent chromium contained as luminescent ions in forsterite.

In the case in which chromium dioxide is used, predetermined oxide materials (MgO, $SiO_2$ as mentioned above) of which forsterite is composed are used together with said chromium dioxide, after which the whole is compressed by a static pressure press to form compressed powder, thrown into an inert atmosphere and then pulled up (withdrawn) while heating the powder to its melting point and rotating seed crystals to be grown up to desired single crystals. It is desirable that the inert atmosphere used herein contain about 0.01–2.0% of oxygen. If the content of oxygen exceeds 2.0% then crucibles used in the atmosphere will be likely to be oxidized and degraded, while if the content of oxygen is less than 0.01% then single crystals having desired quality will be difficultly obtainable. Further, the pulling-up rate is suitably 0.5–3.0 mm/hr; if it exceeds 3.0 mm/hr then single crystals having desired quality will be difficultly obtainable, while if it is less than 0.5 mm/hr then this will be economically disadvantageous.

In the case in which chromium trioxide and/or dichromium trioxide is used, there are added said chromium oxide material together with predetermined materials (MgO and $SiO_2$ as mentioned before) of which forsterite is composed, after which the whole is compressed by a static pressure press to form compressed powder and then sintered to obtain a sintered material. The sintering temperature may range from 700° C. to the melting point (1890° C.) of forsterite and its neighborhood, and the sintering time is at least 4 hours.

The atmosphere in which the sintering is effected varies in nature depending on the contents of chromium trioxide and dichromium trioxide. More specifically, in the case in which the contents of chromium trioxide and dichromium trioxide in the chromium oxide materials used are 30–100 wt. % and 70–0 wt. % respectively, there are employed any non-reducible atmospheres other than reducible atmospheres such as hydrogen gas atmospheres; the non-reducible atmospheres include oxidizable atmospheres such as the atmosphere and an oxygen gas atmosphere and inert gas atmospheres such as a nitrogen or argon gas atmosphere. On the other hand, in a case where the contents of chromium trioxide and dichromium trioxide used are less than 30 to 0 wt. % and over 70 to 100 wt. % respectively, there are employed oxidizable atmospheres such as the atmosphere and an oxygen gas atmosphere.

In the same manner as in the case where chromium dioxide is used as the starting chromium material, the powder so sintered is thrown into an inert atmosphere and then pulled up while raising its temperature to its melting point and rotating seed crystals to be grown up to desired single crystals.

The thus obtained forsterite single crystals containing tetravalent chromium as luminescent ions, contain chromium ions in an amount by weight of 0.001-2.0%, preferably 0.001-1.0%, in the basic forsterite. If the content of chromium ions is less than 0.001% by weight then the resulting crystal will exhibit weak luminescence whereby the crystal is made unsuitable for practical use as laser. On the other hand, if the content of chromium ions exceeds 2.0% by weight, the chromium ions cannot be evenly dissolved in the resulting single crystal thereby to precipitate chromium oxides with their attendant air bubbles, resulting in producing no single crystals of good quality.

Figure 1:
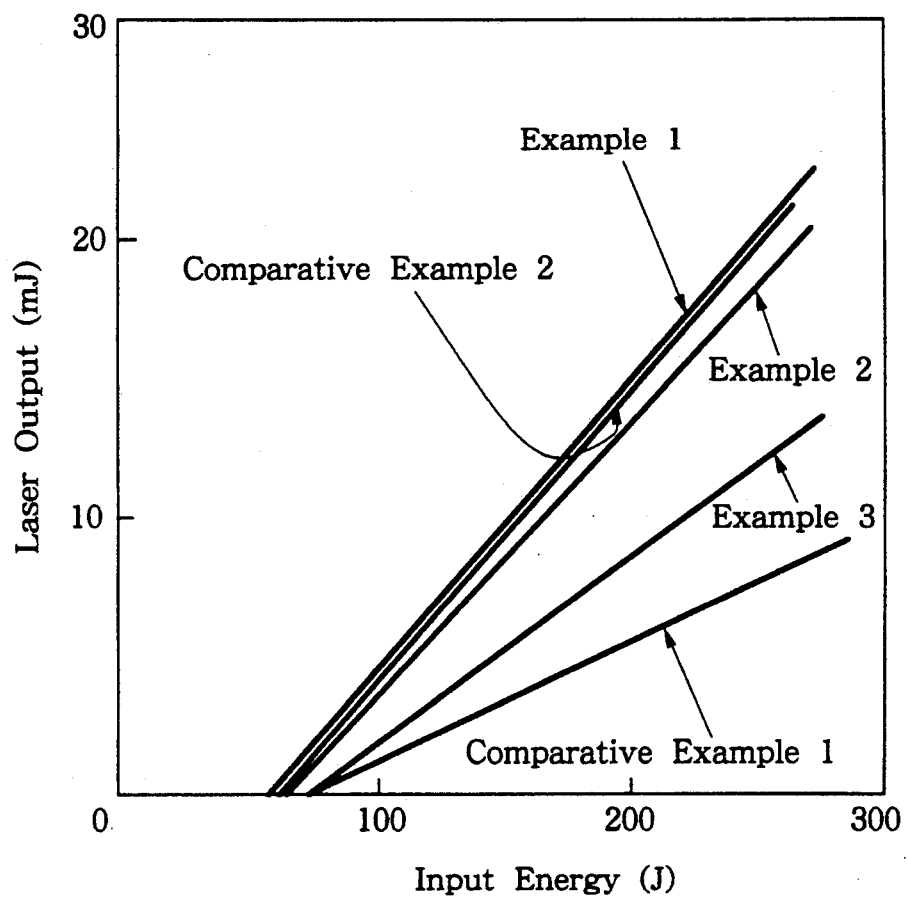
FIG. 1 shows the relationship between input energy and laser output in each of laser oscillation experiments or tests in Examples 1-3 and Comparative Examples 1-2.

This invention will be better understood by the following Examples and Comparative Examples.

DESCRIPTION OF THE PREFERRED EMBODIMENTS (Examples 1-3)

Example 1

Magnesium oxide and silicon oxide were added in such respective amounts that they formed the stoichiometrical composition of forsterite, thereafter incorporated with 0.1% by weight of chromium dioxide ($CrO_2$) and then mixed together. The resulting powder mixture was compressed by a static pressure press (1 ton) to obtain a compressed powder.

The compressed powder so obtained was placed in an iridium-made crucible, raised in temperature to the melting point of the powder in an atmosphere consisting of 99% nitrogen and 1% oxygen and then pulled up at a rate of 1 mm/hr while rotating seed crystals, thereby to obtain desired single crystals.

The thus obtained single crystals varied in color when viewed in different directions and looked red, blue or green respectively.

These single crystals were cut to obtain rods having a size of 5 mm$\phi \times$35 mm long. Both the end surfaces of the thus obtained rods were polished to form smooth surfaces which were in parallel to each other, and then covered respectively with anti-reflective coating by vapor deposition in order to prevent 1230 nm and its neighborhood. Using the thus obtained laser rods, there was made an experiment of laser oscillation by flash lamp excitation. As the flash lamps, there were used two short pulse lamps for exciting dye lasers. Energy thrown for the excitation was 283 J (9 KV, 7 $\mu$F) at the largest. The condenser used in the experiments was cofocal ellipse-shaped in section and silver-plated at the inner side. The oscillator used herein was composed of a mirror having a 2-meter radius with a high reflectance at 1230±50 nm and a planar mirror having a reflectance of 95% at about 1230 nm.

FIG. 1 shows the relationship between the input energy and the laser output in the above laser oscillation experiments.

Example 2

Magnesium oxide and silicon oxide were added in such respective amounts that they formed the stoichiometrical composition of forsterite, thereafter incorporated with 0.1 wt. % of chromium trioxide ($CrO_3$) to obtain a powder mixture. The thus obtained powder mixture was compressed by a static pressure press (1 ton) to form a compressed powder which was placed on a platinum plate and then sintered at 1400° C. for 12 hours in air in an electric furnace to obtain a sintered material.

The thus obtained sintered material was treated in an iridium-made crucible under the same conditions as in Example 1 to be grown up to desired single crystals. During or after the growing-up of the sintered material to the desired crystals, no leakage of the molten liquid was appreciated.

The crystals so obtained were cut to obtain laser rods, 5 mm diameter $\times$ 35 mm long, which were polished and coated by vapor deposition and then subjected to laser oscillation experiment under the same conditions as in Example 1.

FIG. 1 shows the relationship between the input energy and the laser output in this laser oscillation experiment. This Figure indicates approximately the same laser output as that obtained in Example 1.

Comparative Example 1

Magnesium oxide and silicon oxide were added in such respective amounts that they formed the stoichiometrical composition of forsterite, thereafter incorporated with 0.1 wt. % of dichromium trioxide ($Cr_2O_3$) to obtain a powder mixture which was then compressed by a static pressure press (1 ton) to form a compressed powder.

The thus obtained powder was treated in an iridium-made crucible under the same conditions as in Example 1 to be grown up to desired single crystals.

The crystals so obtained were cut to obtain laser rods, 5 mm$\phi \times$ 35 mm long, which were polished and coated by vapor deposition and then subjected to laser oscillation experiment under the same conditions as in Example 1.

FIG. 1 shows the relationship between the input energy between laser output in this laser oscillation experiment. It is seen from this that the laser output was up to a half of that obtained in Examples 1 or 2.

Example 3

The procedure of Example 2 was followed except that the atmosphere in which the sintering was effected was an oxygen atmosphere, to carry out a laser oscillation experiment.

FIG. 1 indicates that the laser output obtained in Example 3 was approximately intermediate between that obtained in Example 1 and that obtained in Comparative Example 1.

Comparative Example 2

The procedure of Comparative Example 1 was followed except that chromium trioxide ($CrO_3$) was substituted for the dichromium trioxide ($Cr_2O_3$) as the chromium material, to make a laser oscillation experiment.

FIG. 1 shows the relationship between the input energy and the laser output with the result that the laser output equal to that in Example 1 was obtained.

By observing the crucible after growing up to desired single crystals, it is appreciated that the crucible caused cracks therein and was unable to be further used as such.

EFFECTS OF THE INVENTION

When the forsterite single crystals obtained by the method of this invention are used as a solid laser host, they will exhibit high laser oscillation. In addition, the single crystals are excellent in economy and producibility since expensive iridium-made crucibles used herein will not be broken during the manufacture of the forsterite single crystals.

What is claimed is:

1. In the method of manufacturing forsterite single crystals containing tetravalent chromium as luminescent ions comprising the steps of
   1) forming pressure-pulverized powder by compressing oxide materials consisting of magnesium oxide and silicon dioxide by a static pressure press,
   2) throwing said powder from step 1) into an inert atmosphere containing about 0.01-2.0% of oxygen, and
   3) lifting up while heating the powder to its melting point and rotating it together with seed crystals to be grown up to desired single crystals,
   the improvement which comprises the use of chromium dioxide as the chromium material and adding said chromium dioxide to magnesium oxide and silicon dioxide in step 1).

2. The method according to claim 1 where in step 3) the rate of pulling up is 0.5-3 mm/hr.

3. In the method of manufacturing forsterite single crystals containing tetravalent chromium as luminescent ions comprising the steps of
   1) forming pressure-pulverized powder by compressing oxide materials consisting of magnesium oxide, silicon dioxide and a chromium material by a static pressure press,
   2) sintering the thus formed compressed powder in the temperature range of from about 700° to about 1890° C. for at least 4 hours in an atmosphere selected from the group consisting of the atmosphere, an oxygen gas, a nitrogen or argon gas, whereby sintered powder is obtained,
   3) throwing said sintered powder into an inert atmosphere containing about 0.01-2.0% of oxygen, and
   4) lifting up while heating the powder to its melting point and rotating it together with seed crystals to be grown up to desired single crystals,
   the improvement wherein the chromium material is a member selected from the group consisting of chromium trioxide and mixtures thereof containing 30-100% by weight of chromium trioxide and 0-70% by weight of dichromium trioxide, adding said selected member to said oxide materials in step 1) and sintering said powder in a non-reducing atmosphere.

4. The method according to claim 3 wherein in said step 4) the rate of pulling up is 1 mm/hr.

5. In the method for manufacturing forsterite single crystals containing tetravalent chromium as luminescent ions comprising the steps of
   1) forming pressure-pulverized powder by compressing oxide materials consisting of magnesium oxide, silicon dioxide and a chromium material by a static pressure press,
   2) sintering the thus formed compressed powder from step 1) at a temperature range of from about 700° to about 1890° C. for at least 4 hours in an atmosphere selected from the group consisting of the atmosphere or an oxygen gas to obtain sintered powder,
   3) throwing said sintered powder into an inert atmosphere containing about 0.01-2.0% of oxygen, and
   4) lifting up while heating the powder to its melting point and rotating it together with seed crystals to be grown up to desired single crystals,
   the improvement wherein the chromium material is a member selected from the group consisting of dichromium trioxide and mixtures of more than 70% by weight up to 100% of dichromium trioxide with 0 up to less than 30% by weight of chromium trioxide, firing said mixture together with other oxide materials in an oxidizing atmosphere to obtain a fired body.

* * * * *